United States Patent
Ogiwara et al.

(10) Patent No.: US 7,679,412 B2
(45) Date of Patent: Mar. 16, 2010

(54) POWER SUPPLY CIRCUIT (75) Inventors: Ryu Ogiwara, Yokohama (JP);
Daisaburo Takashima, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/239,188

(22) Filed: Sep. 26, 2008

(65) Prior Publication Data

US 2009/0096506 A1    Apr. 16, 2009

(30) Foreign Application Priority Data

Sep. 27, 2007  (JP)  ............... P2007-252030

(51) Int. Cl.
*H03L 7/00*  (2006.01)
(52) U.S. Cl. .............. 327/143; 327/198; 365/145
(58) Field of Classification Search ........ 327/142, 327/143, 198; 365/145
See application file for complete search history.

(56) References Cited

U.S. PATENT DOCUMENTS

| 5,319,601 | A | * | 6/1994 | Kawata et al. ............ 365/226 |
| 5,778,238 | A |   | 7/1998 | Hofhine |
| 6,624,673 | B2 | * | 9/2003 | Kim ......................... 327/143 |
| 7,586,350 | B2 | * | 9/2009 | Chung et al. ............ 327/198 |

2005/0275437 A1    12/2005  Suzuki et al.

FOREIGN PATENT DOCUMENTS

| JP | 10-511492 | 11/1998 |
| JP | 2001-283593 | 10/2001 |
| JP | 2003-196974 | 7/2003 |

OTHER PUBLICATIONS

Hironori Banba, et al., "A CMOS Bandgap Reference Circuit with Sub-1-V Operation", IEEE Journal of Solid-State Circuits, vol. 34, No. 5, May 1999, pp. 670-674.

* cited by examiner

*Primary Examiner*—Lincoln Lincoln
*Assistant Examiner*—William Hernandez
(74) *Attorney, Agent, or Firm*—Oblon, Spivak, McClelland, Maier & Neustadt, L.L.P.

(57) ABSTRACT

According to an aspect of the present invention, there is provided a power supply circuit including: a detection circuit that is connected to an external power supply voltage and that outputs a first signal indicating whether the external power supply voltage is in a dropped-state in which the external power supply voltage is dropped below a reference voltage; a control circuit that includes: a delay circuit that outputs a second signal acquired by delaying the first signal for a reference time; and a determination circuit that outputs a third signal based on the first signal and the second signal; a generation circuit that generates internal power supply voltage from the external power supply voltage and that supplies the internal power supply voltage; and an interruption circuit that interrupts the internal power supply voltage supplied from the generation circuit based on the third signal.

15 Claims, 14 Drawing Sheets

POWER SUPPLY CIRCUIT

CROSS-REFERENCE TO RELATED APPLICATIONS

This application claims priority from Japanese Patent Application No. 2007-252030 filed on Sep. 27, 2007, the entire contents of which are incorporated herein by reference.

BACKGROUND OF THE INVENTION

1. Field of the Invention

An aspect of the present invention relates to a power supply circuit.

2. Description of the Related Art

A ferroelectric memory as one of nonvolatile semiconductor storage devices has a plurality of internal power supply voltage generation circuits provided in a chip to select a memory cell and to control a storage operation. These internal power supply voltages are controlled to start generating an internal power supply voltage when an external power supply is turned on and an external power supply voltage exceeds a predetermined voltage. For that purpose, a power supply turn-on detection circuit for detecting turn-on of the external power supply is provided in the chip.

A reading operation of reading out data stored in such a ferroelectric memory is a destructive reading operation of destroying data stored in a memory cell. This causes a problem that upon interruption of an external power supply in the middle of a reading operation, data stored in a memory cell is destroyed by occurrence of an access to the memory cell.

Thus, it is desired for preventing such destruction of data that when an external power supply voltage is equal to or lower than a predetermined value, at least an internal power supply voltage to be supplied to a memory cell array becomes 0 V.

Thus, a power supply voltage detection circuit for detecting a change in the external power supply voltage has hitherto been provided in a chip to enable the detection of interruption of the external power supply in addition to the turn-on of the external power supply. Consequently, the activation and the discharging of the internal power supply voltage generation circuit are controlled (see, e.g., JP-2003-196974-A).

However, sometimes, an external power supply voltage drops due to noise or the like only for a short time. Thus, a conventional power supply circuit has a problem in that when the internal power supply voltage supplied to a memory cell array is discharged to 0 V in such a case, it takes long time to restore the voltage and increases power consumption.

SUMMARY OF THE INVENTION

According to an aspect of the present invention, there is provided a power supply circuit including: a detection circuit that is connected to an external power supply voltage and that outputs a first signal indicating whether the external power supply voltage is in a dropped-state in which the external power supply voltage is dropped below a reference voltage; a control circuit that includes: a delay circuit that outputs a second signal acquired by delaying the first signal for a reference time; and a determination circuit that outputs a third signal based on the first signal and the second signal; a generation circuit that generates internal power supply voltage from the external power supply voltage and that supplies the internal power supply voltage; and an interruption circuit that interrupts the internal power supply voltage supplied from the generation circuit based on the third signal.

According to another aspect of the present invention, there is provided a power supply circuit including: a detection circuit connected to an external power supply voltage and configured to detect that the external power supply voltage is in a dropped-state in which the external power supply voltage is dropped below a reference voltage; a generation circuit configured to generate an internal power supply voltage from the external power supply voltage; an interruption circuit configured to interrupt the internal power supply voltage output from the generation circuit; and a control circuit configured to determine whether a continuation time of the dropped-state is shorter than a reference time and to control the interruption circuit based on a determined result, wherein the control circuit inhibits the interruption circuit from performing an interruption operation when determining that the continuation time of the dropped-state is shorter than the reference time.

BRIEF DESCRIPTION OF THE DRAWINGS

Embodiments may be described in detail with reference to the accompanying drawings, in which.

DETAILED DESCRIPTION OF THE INVENTION

Hereinafter, embodiments of the present invention are described with reference to the accompanying drawings.

Embodiment 1

Figure 1:
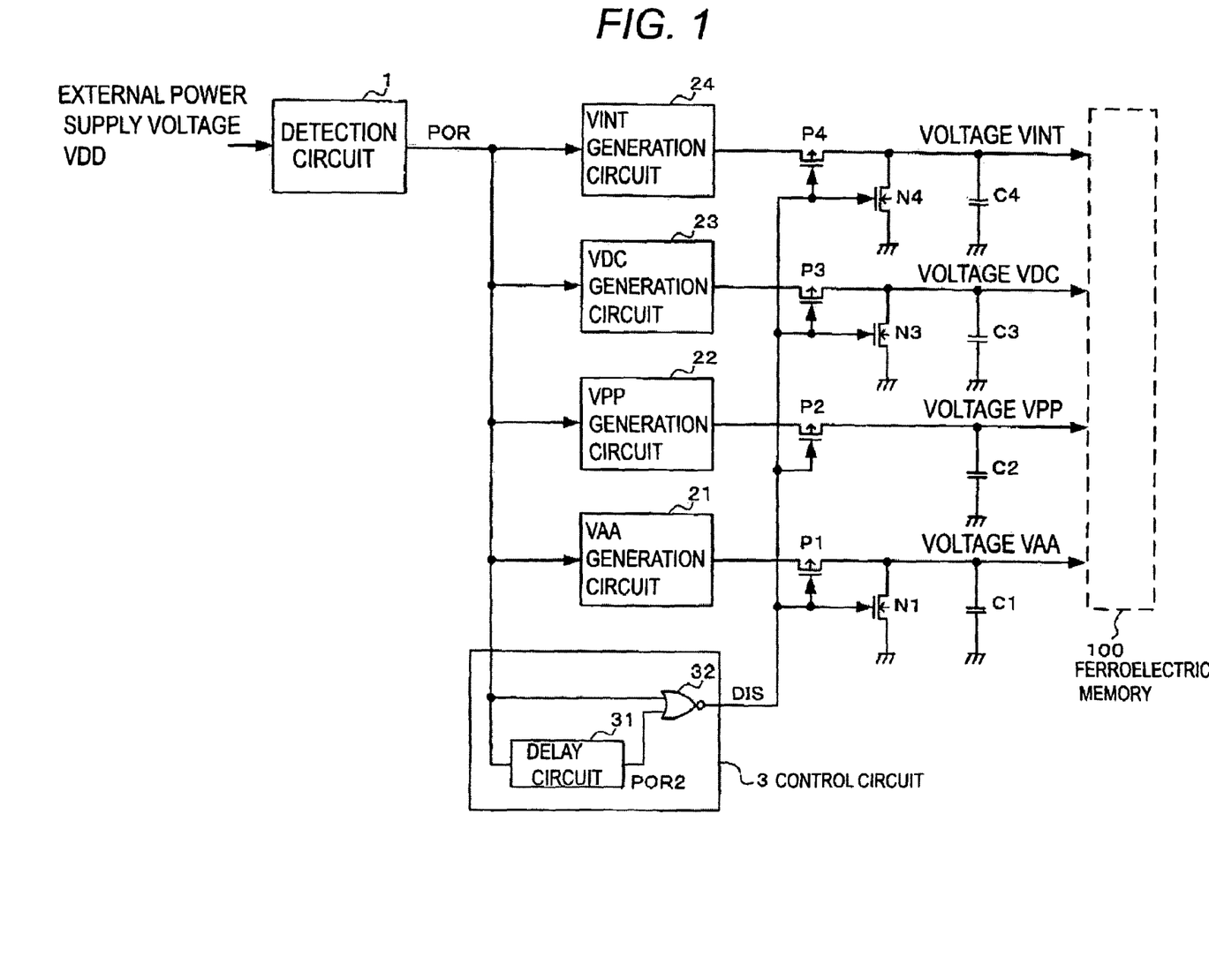
FIG. 1 is a block diagram illustrating an exemplary configuration of a power supply circuit according to Embodiment 1 of the present invention.

FIG. 1 is a block diagram illustrating an exemplary configuration of a power supply circuit according to Embodiment 1 of the present invention. The power supply circuit according to Embodiment 1 is mounted in a semiconductor apparatus together with a ferroelectric memory 100. The power supply circuit generates an internal power supply voltage to be supplied to the ferroelectric memory 100 from an external power supply voltage VDD.

The power supply circuit according to the present embodiment includes: a detection circuit 1 that detects voltage value of the external power supply voltage VDD; a VAA generation circuit 21, a VPP generation circuit 22, a VDC generation circuit 23, and a VINT generation circuit 24 that respectively generates a voltage VAA, a voltage VPP, a voltage VDC, and a voltage VINT from the external power supply voltage VDD; P-channel metal oxide semiconductor (PMOS) transistors P1, P2, P3, and P4 serving as interruption circuits that respectively stop the outputs of the VAA generation circuit 21, the VPP generation circuit 22, the VDC generation circuit 23, and the VINT generation circuit 24; and an control circuit 3 that determines, when the detection circuit 1 detects the external power supply voltage VDD becomes a dropped state in which the external power supply voltage VDD drops below a reference voltage, whether a continuing time of the dropped state exceeds a reference time, and that controls the PMOS transistors P1, P2, P3, and P4 based on the determined result.

In the present embodiment, the VAA generation circuit 21, the VPP generation circuit 22, the VDC generation circuit 23, and the VINT generation circuit 24 start the generation of the internal voltages when the external power supply voltage VDD exceeds the reference voltage.

The internal power supply voltages are supplied from the VAA generation circuit 21, the VPP generation circuit 22, the VDC generation circuit 23 and the VINT generation circuit 24 to the ferroelectric memory 100 through internal power supply lines via the transistors P1, P2, P3, and P4. Capacitors C1, C2, C3, and C4 are respectively connected to the internal power supply lines to stably hold the voltage.

Further, the voltage VAA output from the VAA generation circuit 21 is supplied to a row decoder, a column decoder, a sense amplifier, and a plate driver of the ferroelectric memory 100 provided to select a memory cell. The voltage VDC output from the VDC generation circuit 23 is supplied to a dummy capacitor.

Thus, each of N-channel metal oxide semiconductor (NMOS) transistors N1 and N3 serving as discharging circuit is connected between a grounding terminal and an associated one of the power supply lines respectively corresponding to the voltage VAA and the voltage VDC to quickly put, when the external power supply voltage VDD is interrupted, the voltage into 0 V. The NMOS transistors N1 and N3 is controlled by the control circuit 3.

The control circuit 3 includes a delay circuit 31 that delays an output POR of the detection circuit 1 by a reference time ts, and a NOR-gate 32 serving as a determination circuit that compares the output POR of the detection circuit 1 with an output POR2 of the delay circuit 31 to determine whether both of the outputs POR and POR2 indicate that the external power supply voltage VDD drops below the reference voltage.

Figure 2:
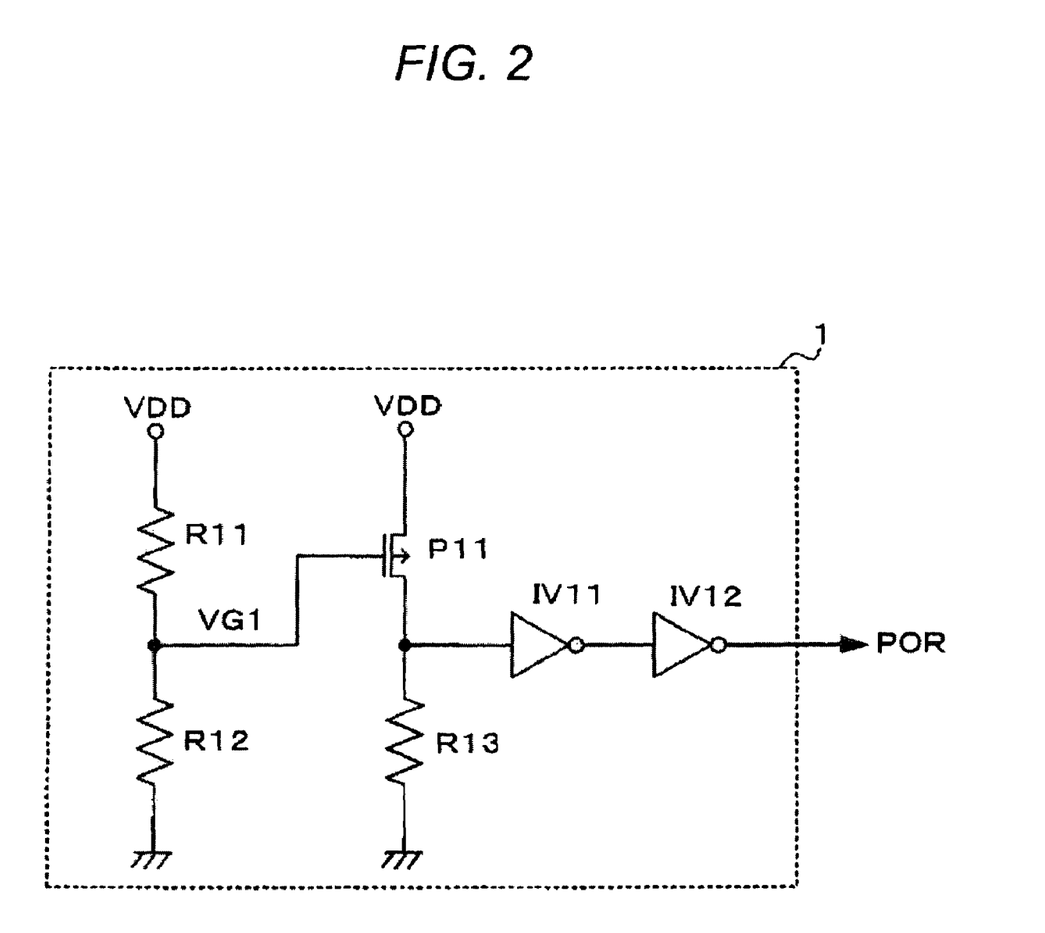
FIG. 2 is a circuit diagram illustrating an exemplary configuration of a detection circuit according to the embodiment.

FIG. 2 is a circuit diagram illustrating an exemplary configuration of the detection circuit 1.

The detection circuit 1 includes resistors R11 and R12, which are series-connected between the external power supply voltage VDD and a grounding terminal and divide the external power supply voltage VDD, a PMOS transistor P11 that has a source electrode connected to the external power supply voltage VDD and that has a gate electrode to which the divided voltage VG1 by the resistors R11 and R12 is input, a resistor R13 connected between the drain electrode of the PMOS transistor P11 and a grounding terminal, an inverter IV11 to which an output of the PMOS transistor P11 is input, and an inverter IV12 to which an output of the inverter IV11 is input. An output of the inverter IV12 is the output POR of the detection circuit 1.

Figure 3:
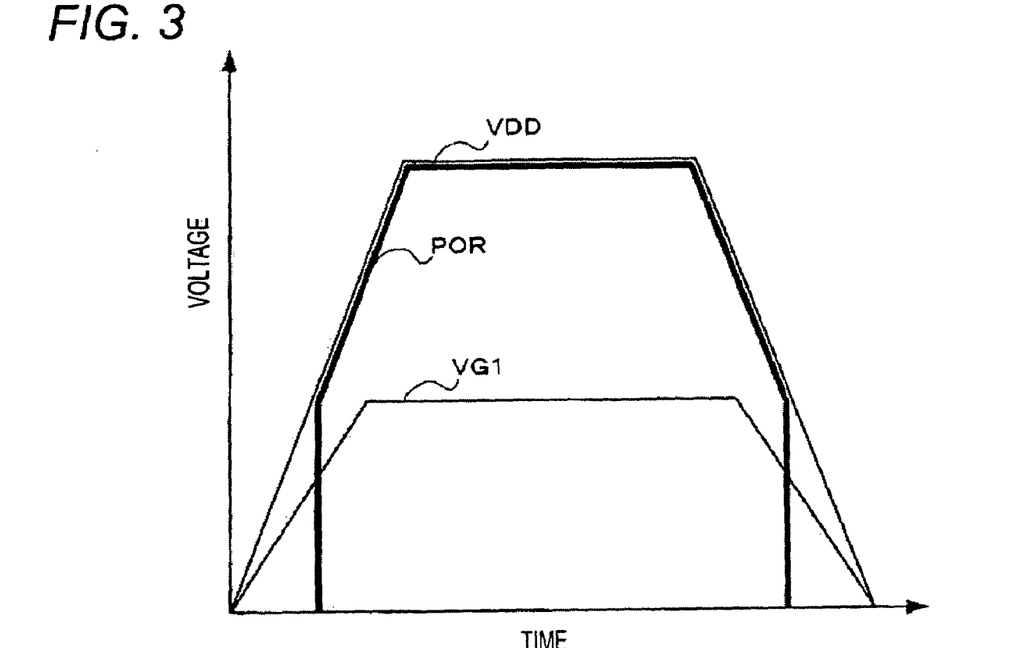
FIG. 3 is a waveform chart illustrating an example of an operation of the detection circuit according to the embodiment.

FIG. 3 is a waveform chart illustrating an example of an operation of the detection circuit 1 illustrated in FIG. 2.

As illustrated in FIG. 3, when the external power supply voltage VDD rises from 0, the divided voltage VG1 also rises. Then, when the voltage difference (VDD−VG1) exceeds a threshold voltage of the PMOS transistor P11, the PMOS transistor P11 conducts. The output voltage level of the PMOS transistor P11 is the voltage level of the external power supply voltage VDD. The output POR of the detection circuit 1 is "H".

On the other hand, when the external power supply voltage VDD begins dropping and the voltage difference (VDD−VG1) drops from the threshold voltage of the PMOS transistor P11, the PMOS transistor P11 becomes nonconductive. Thus, a drain voltage level of the PMOS transistor P11 is lowered to a grounding voltage level through the resistor R13. The output POR of the detection circuit 1 is "L".

Thus, the detection circuit 1 can detect whether the external power supply voltage VDD is higher than a certain constant voltage level.

Figure 4:
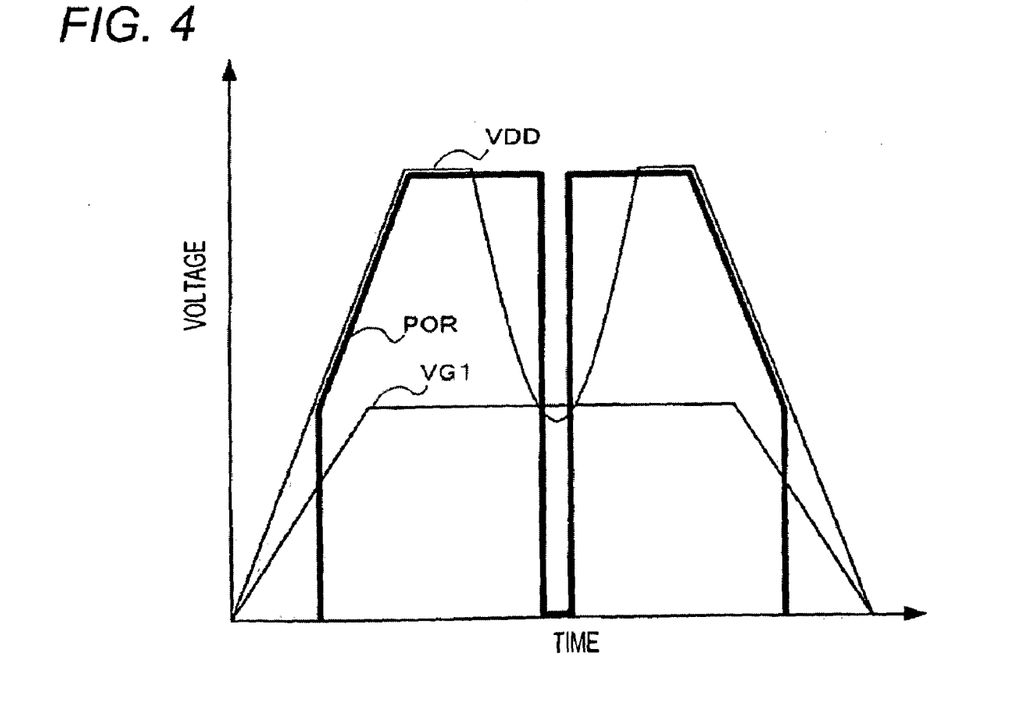
FIG. 4 is a waveform chart illustrating an example of an operation of the detection circuit according to the embodiment.

When the external power supply voltage VDD drops for a short time, the detection circuit 1 operates as follows.

FIG. 4 is a waveform chart illustrating an example of an operation of the detection circuit 1 in a case where the external power supply voltage VDD drops for a short time.

As illustrated in FIG. 4, the output POR of the detection circuit 1 is "L" for a short time in a case where the external power supply voltage VDD drops for a short time.

A conventional power supply circuit stops the supply of an internal power supply voltage to a ferroelectric memory even in a case where such a detection circuit detects that the external power supply voltage VDD drops for a short time.

In contrast, in the present embodiment, in a case where a time, during which the output POR of the detection circuit 1 is "L", is shorter than a reference time ts, the supply of the internal power supply voltage to the ferroelectric memory is not stopped.

Accordingly, in the present embodiment, the control circuit 3 operates as follows.

Figure 5:
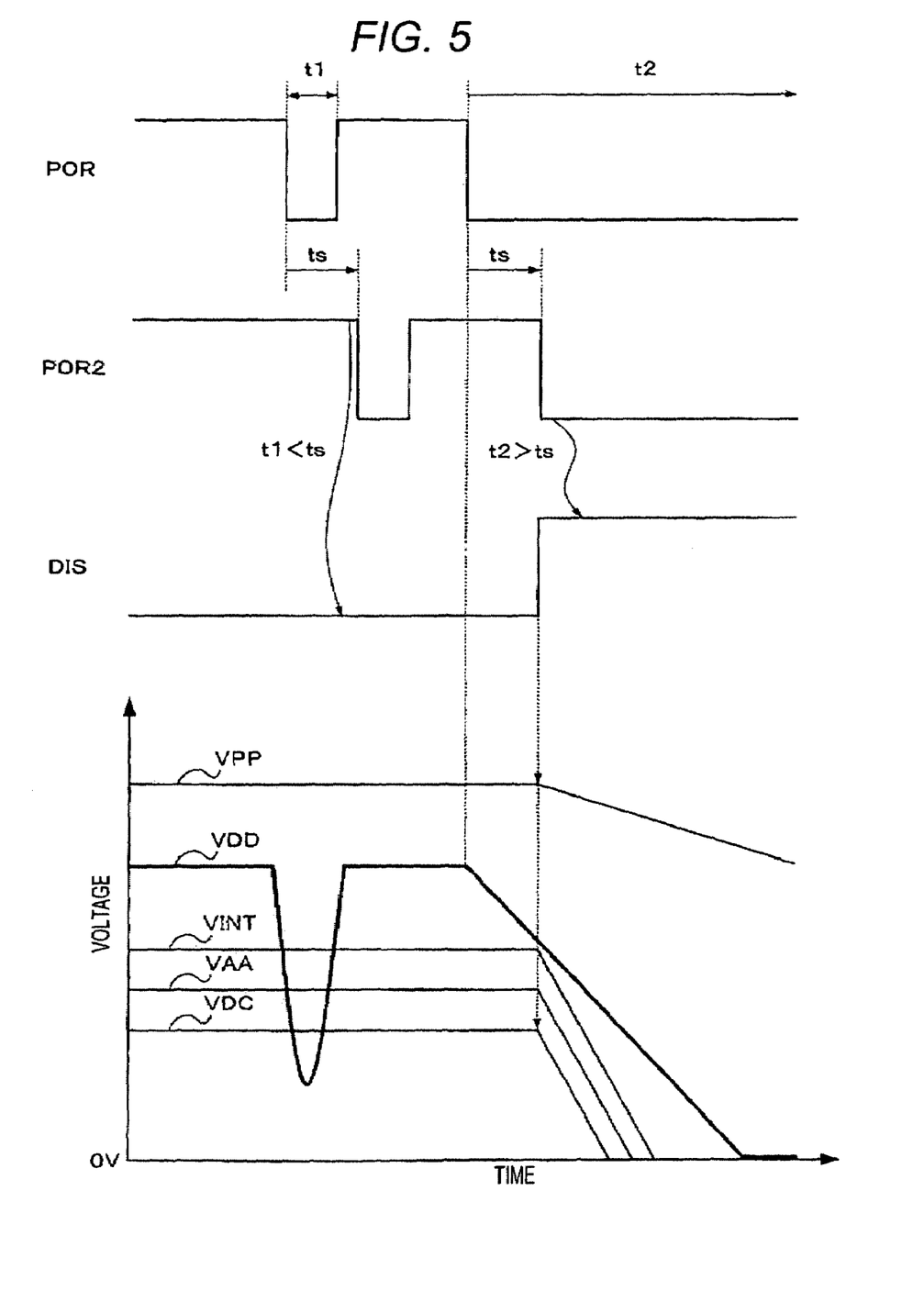
FIG. 5 is a waveform chart illustrating an example of an external power supply voltage stopping operation of Embodiment 1.

FIG. 5 is a waveform chart illustrating an example of an operation of stopping the internal power supply voltage according to an output of the control circuit 3.

When the external power supply voltage VDD drops and the output POR of the detection circuit 1 is "L", a time-period t1, during which the output POR of the detection circuit 1 is "L", is shorter than the reference time ts (t1<ts), the output POR2 of the delay circuit 31 does not become "L" for a time during which the output POR of the detection circuit 1 is "L".

Thus, an output DIS of the NOR gate 32 remains "L". That is, the NOR gate 32 determines that both of the output POR of the detection circuit 1 and the output POR2 of the delay circuit 31 are not the level (i.e., "L") indicating that the external power supply voltage VDD drops below the reference voltage.

Consequently, the PMOS transistors P1, P2, P3, and P4 remain conductive. The voltage VAA, the voltage VPP, the voltage VDC, and the voltage VINT are maintained without change.

On the other hand, in a case where a time-period t2, during which the output POR of the detection circuit 1 is "L", is longer than the reference time ts (t2>ts), the output POR2 of the delay circuit 31 becomes "L" during a time in which the output POR of the detection circuit 1 is "L".

Thus, the output DIS of the NOR gate 32 is changed to a level "H". That is, the NOR gate 32 determines that both of the output POR of the detection circuit 1 and the output POR2 of the delay circuit 31 are the level (i.e., "L") indicating that the external power supply voltage VDD drops below the reference voltage.

Consequently, the PMOS transistors P1, P2, P3, and P4 become nonconductive. Thus, outputs of the internal power supply voltages from the VAA generation circuit 21, the VPP generation circuit 22, the VDC generation circuit 23, and the VINT generation circuit 24 are stopped.

The voltage VPP gradually drops due to natural discharge.

On the other hand, the voltage VAA and the voltage VDC rapidly drop, because the NMOS transistors N1 and N3 serving as the discharging circuits are conducted. Consequently, data stored in the memory cell is protected.

The detection circuit 1 illustrated in FIG. 2 is configured to detect the level of the external power supply voltage VDD through the threshold voltage of the PMOS transistor P11. The threshold voltage has a temperature dependency. Next, an exemplary configuration of the detection circuit 1 that is not affected by the temperature-dependency of the threshold voltage is described below.

Figure 6:
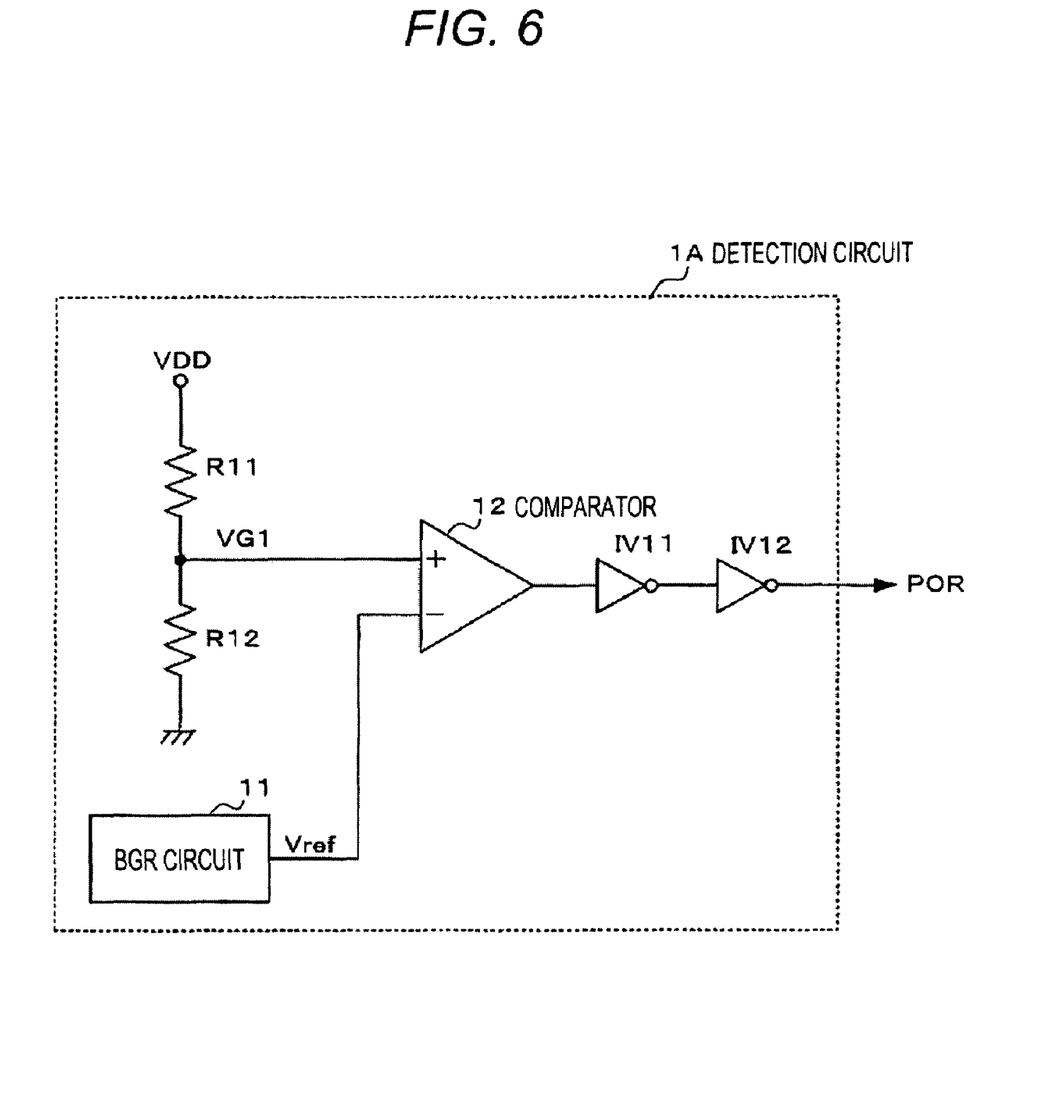
FIG. 6 is a circuit diagram illustrating another exemplary configuration of the detection circuit according to the embodiment.

FIG. 6 is a circuit diagram illustrating an exemplary configuration of the detection circuit 1A utilizing a bandgap voltage that is a temperature-independent constant voltage.

In the detection circuit 1A illustrated in FIG. 6, the voltage level VG1 that is obtained by dividing the external power supply voltage VDD using the resistors R11 and R12 is compared with a reference voltage Vref that is generated by a bandgap reference (BGR) circuit 11 by a comparator 12. Thus, the rise and fall of the external power supply voltage VDD are detected.

Figure 7:
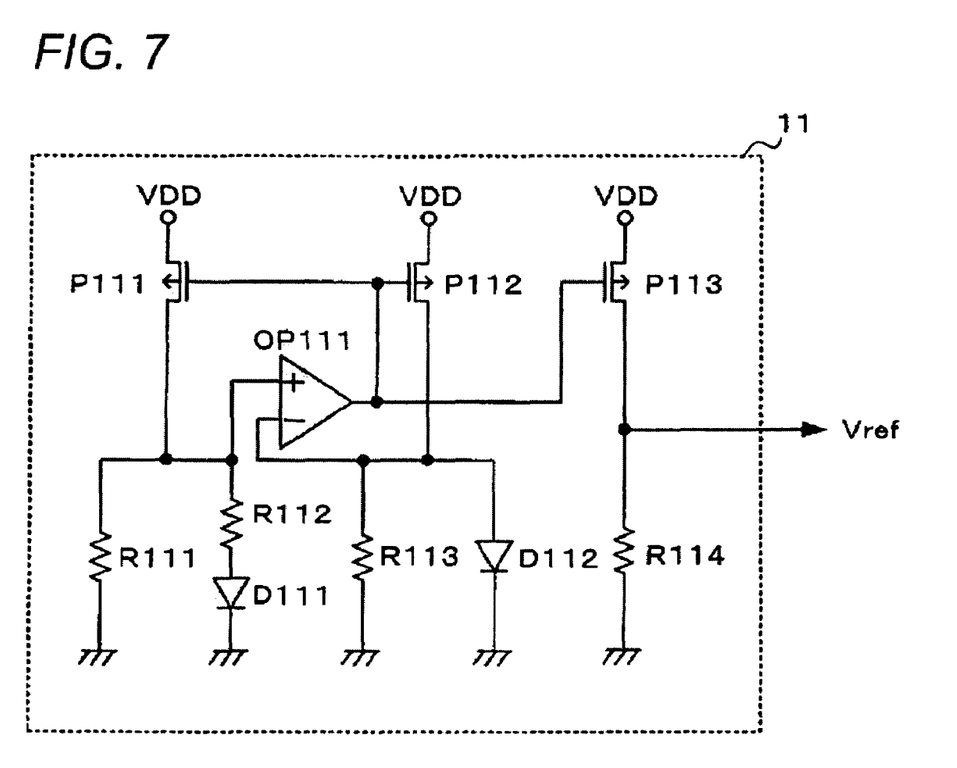
FIG. 7 is a circuit diagram illustrating an example of a BGR circuit.

FIG. 7 illustrates an example of the circuit configuration of the BGR circuit 11. The BGR circuit 11 includes PMOS transistors P111-P113, resistors R111-R114, diodes D111-D112 and an operational amplifier OP111. This circuit is described in a document (H. Banba, et al. "A CMOS bandgap reference circuit with sub-1V operation", IEEE J. Solid-State Circuits, May 1999, Vol. 34, No. 5, p. 671). Thus, the detail description of this circuit is omitted. This circuit is configured to generate the temperature-independent reference voltage Vref by adjusting currents flowing the diodes D111-D112 and the resistors R111-R113.

Next, an exemplary circuit configuration of the delay circuit 31 used in the control circuit 3 is described below.

Figure 8:
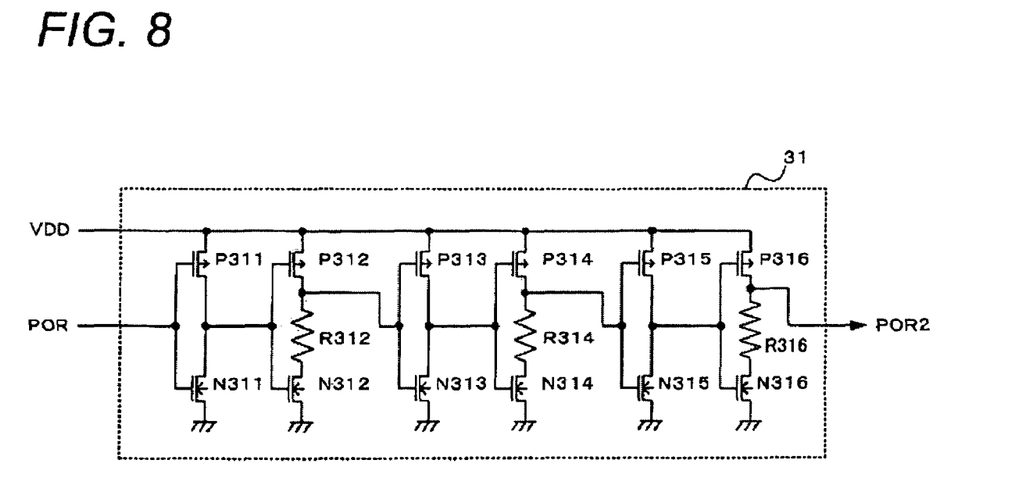
FIG. 8 is a circuit diagram illustrating an exemplary configuration of a delay circuit according to the embodiment.

FIG. 8 illustrates an exemplary configuration of the delay circuit 31 using multiple stages of inverters. For example, a first stage inverter is an ordinary inverter and is constituted by a PMOS transistor P311 and an NMOS transistor N311.

On the other hand, a second stage inverter includes a resistor R312 which is inserted in series between an output terminal of the inverter and the NMOS transistor N312, in addition to a PMOS transistor P312 and an NMOS transistor N312. The fall of an output of this inverter is made by the insertion of the resistor R312 to be slower than ordinary inverters.

In the same manner, third and fifth stage inverters are configured by PMOS transistors P313 and P315 and NMOS transistors N313 and N315, and fourth and sixth stage inverters are configured by PMOS transistors P314 and P316, NMOS transistors N314 and N316 and resistors R314 and R316.

Thus, the fall of a POR signal to be input to the delay circuit 31 can efficiently be delayed by inserting a resistor into an even-numbered stage inverter, as compared with the case of constituting the delay circuit 31 only by ordinary inverters.

The delay circuit 31 illustrated in FIG. 8 is such that the external power supply voltage VDD is the power supply voltage.

Figure 9:
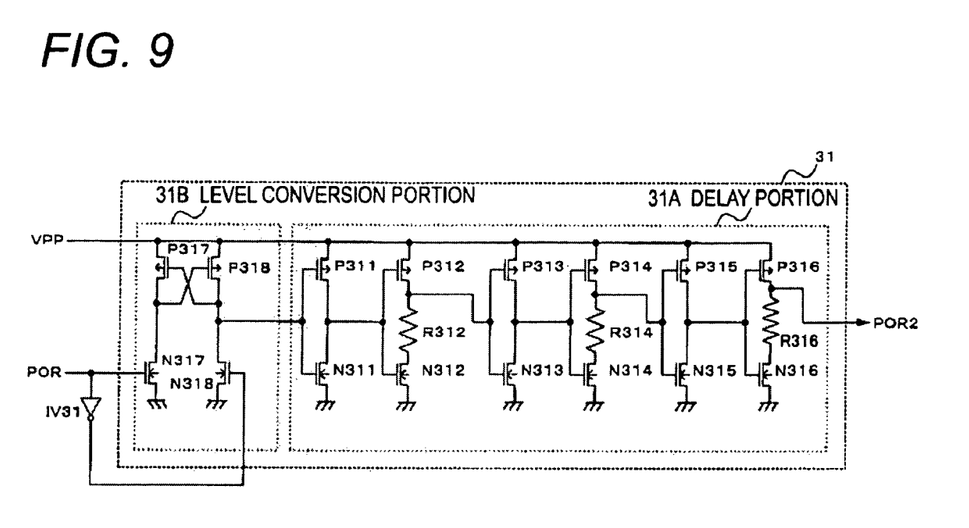
FIG. 9 is a circuit diagram illustrating another exemplary configuration of the delay circuit according to the embodiment.
Figure 10:
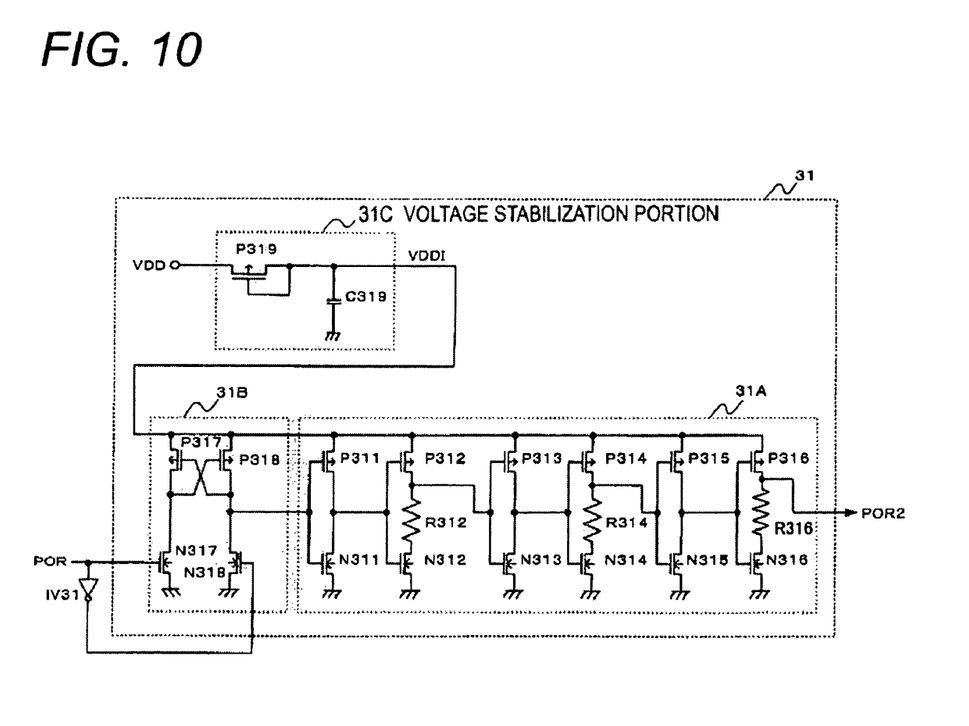
FIG. 10 is a block diagram illustrating an exemplary configuration of a power supply circuit according to Embodiment 2 of the present invention.

FIGS. 9 and 10 illustrate exemplary configuration of the delay circuit 31 using a power supply voltage other than the external power supply voltage VDD.

FIG. 9 illustrates an exemplary configuration of the delay circuit 31 using the voltage VPP as the power supply voltage.

Usually, the voltage VPP is set to be higher than that of the external power supply voltage VDD. Also, the capacity of the capacitor C2 is set to be high in order to stably maintain the voltage. Thus, an effect of the variation of the external power supply voltage VDD to the delay circuit 31 is prevented.

The delay circuit illustrated in FIG. 9 includes a delay portion 31A of a configuration similar to that of the delay circuit 31 illustrated in FIG. 8, and a level conversion portion 31B for converting the POR signal, which is input thereto at the level of the external power supply voltage VDD, into the level of the voltage VPP.

The level conversion portion 31B includes PMOS transistors P317 and P318 and NMOS transistors N317 and N318, and an inverter IV31 is connected to the NMOS transistors N317 and N318.

The POR signal output from the detection circuit 1 is input to the delay portion 31A via the level conversion portion 31B. Then, the input POR signal is delayed by the reference time ts and is output from the delay portion 31A as a POR2 signal.

FIG. 10 illustrates an example of using internal voltage VDDI generated from the external power supply voltage VDD as the power supply voltage for the delay circuit 31.

The delay circuit 31 illustrated in FIG. 10 includes a delay portion 31A and a level conversion portion 31B, similarly to the delay circuit 31 illustrated in FIG. 9. The delay circuit 31 illustrated in FIG. 10 further includes a voltage stabilization portion 31C that generates the internal voltage VDDI.

The voltage stabilization portion 31C includes a PMOS transistor P319 which has a source electrode connected to the external power supply voltage VDD and has a gate electrode connected to the drain electrode, and a high-capacity capacitor C319 connected between the drain electrode of the PMOS transistor P319 and a grounding terminal. The voltage of the drain electrode of the PMOS transistor P319 is output as the internal voltage VDDI.

The level of the internal voltage VDDI is maintained at a value, which is lower than the level of the external power supply voltage VDD by a threshold voltage of the PMOS transistor P319, because the gate electrode of the PMOS transistor P319 is connected to the drain electrode thereof.

Further, because the capacity of the capacitor C319 is high, even when the external power supply voltage VDD is interrupted, the internal voltage VDDI is maintained without change for a while. Accordingly, an effect of the variation of the external power supply voltage VDD to the delay circuit 31 is prevented.

According to the present embodiment, it can be controlled according to the length of a time, during which the external power supply voltage drops, whether the supply of the generated internal power supply voltage is stopped. Consequently, in a case where the external power supply voltage drops due to noise or the like for a short time, the supply of the internal power supply voltage can be prevented from being stopped. Thus, the present embodiment can contribute to a reduction in power consumption caused at restoration of the voltage and to the speeding-up and smoothing of an operation of a ferroelectric memory to which the internal power supply voltage is supplied.

In addition, when the external power supply is interrupted, the voltage of the memory cell array power supply can quickly be discharged. Consequently, the destruction of cell data stored in a ferroelectric memory can be prevented.

Embodiment 2

Figure 11:
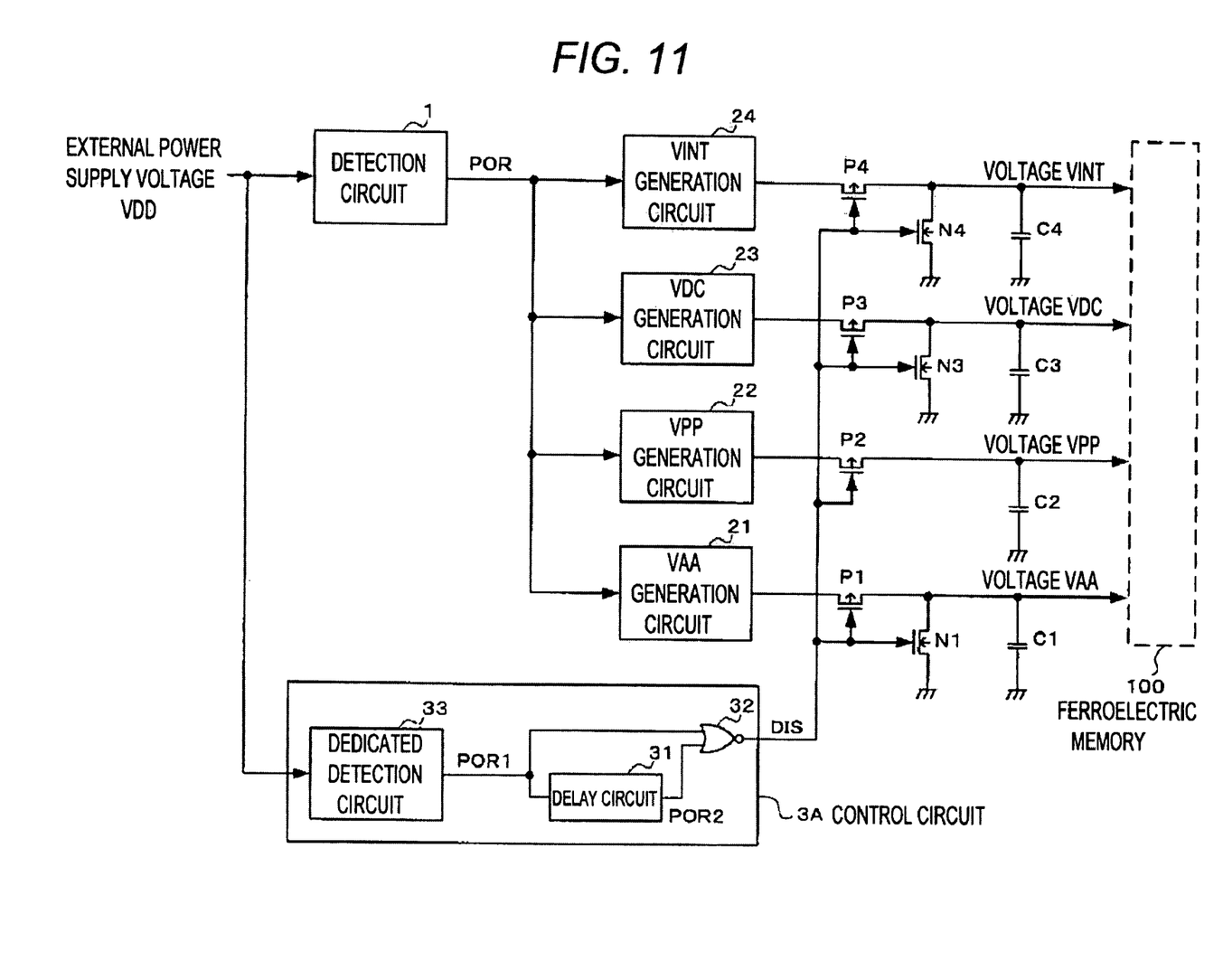
FIG. 11 is a circuit diagram illustrating an exemplary configuration of a control circuit according to Embodiment 2.

FIG. 11 is a block diagram illustrating an exemplary configuration of a power supply circuit according to Embodiment 2 of the present invention.

The present embodiment differs from Embodiment 1 in that an control circuit 3A is provided with a dedicated detection circuit 33 which has a configuration similar to that of the detection circuit 1 and which outputs a POR1 signal for exclusively use in the control circuit 3A.

In Embodiment 1, a circuit illustrated in FIG. 2 is used to detect both of the turn-on of a power supply and the interruption of the power supply. When a power supply is turned on in the circuit illustrated in FIG. 2, the PMOS transistor P11 is turned on and the input voltage of the inverter IV11 rises. Thus, the circuit illustrated in FIG. 2 responds to the rise of the external power supply voltage VDD at high speed.

On the other hand, when the power supply is interrupted, the external power supply voltage VDD falls. Thus, the divided voltage VG1 obtained using the resistors R11 and R12 becomes "H" with respect to the external power supply voltage VDD, the PMOS transistor P11 is turned off, and the input voltage of the inverter IV11 decreases. Here, the parasitic capacity of the resistor R13 affects the response speed to the fall of the external power supply voltage VDD.

In Embodiment 2, the control circuit 3A is constructed as illustrated in FIG. 11. The entire control circuit 3A including the dedicated detection circuit 33 is operated using a power supply voltage other than the external power supply voltage VDD.

Figure 12:
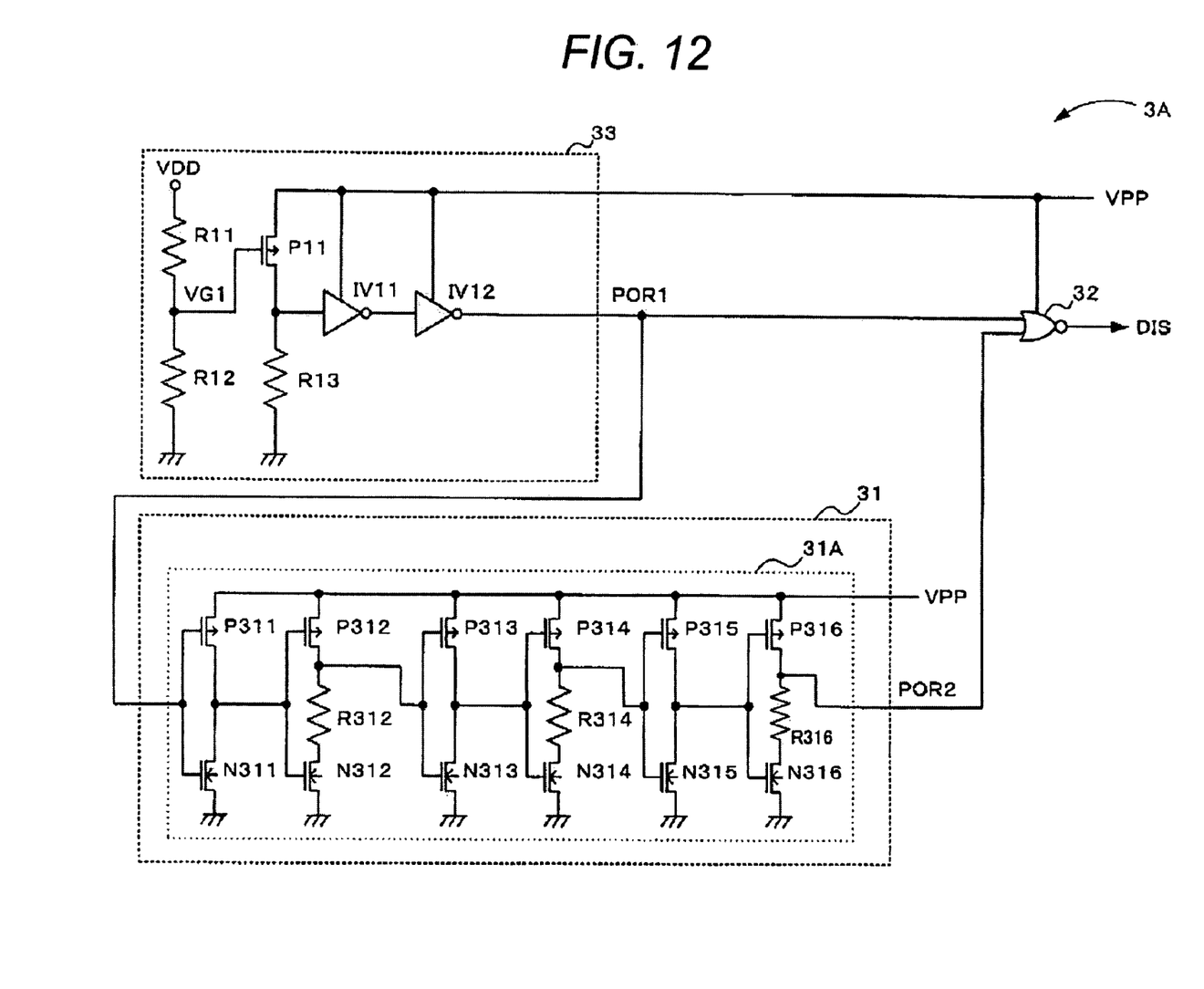
FIG. 12 is a circuit diagram illustrating another exemplary configuration of the control circuit according to Embodiment 2.

FIG. 12 illustrates an example of using the voltage VPP as the power supply voltage for the control circuit 3A. In this illustrated example, the dedicated detection circuit 33 has a circuit configuration similar to that of the detection circuit 1 illustrated in FIG. 2.

Because the voltage VPP is supplied also to the dedicated detection circuit 33, the POR1 signal output therefrom can be input directly to the delay portion 31A without performing level conversion.

Figure 13:
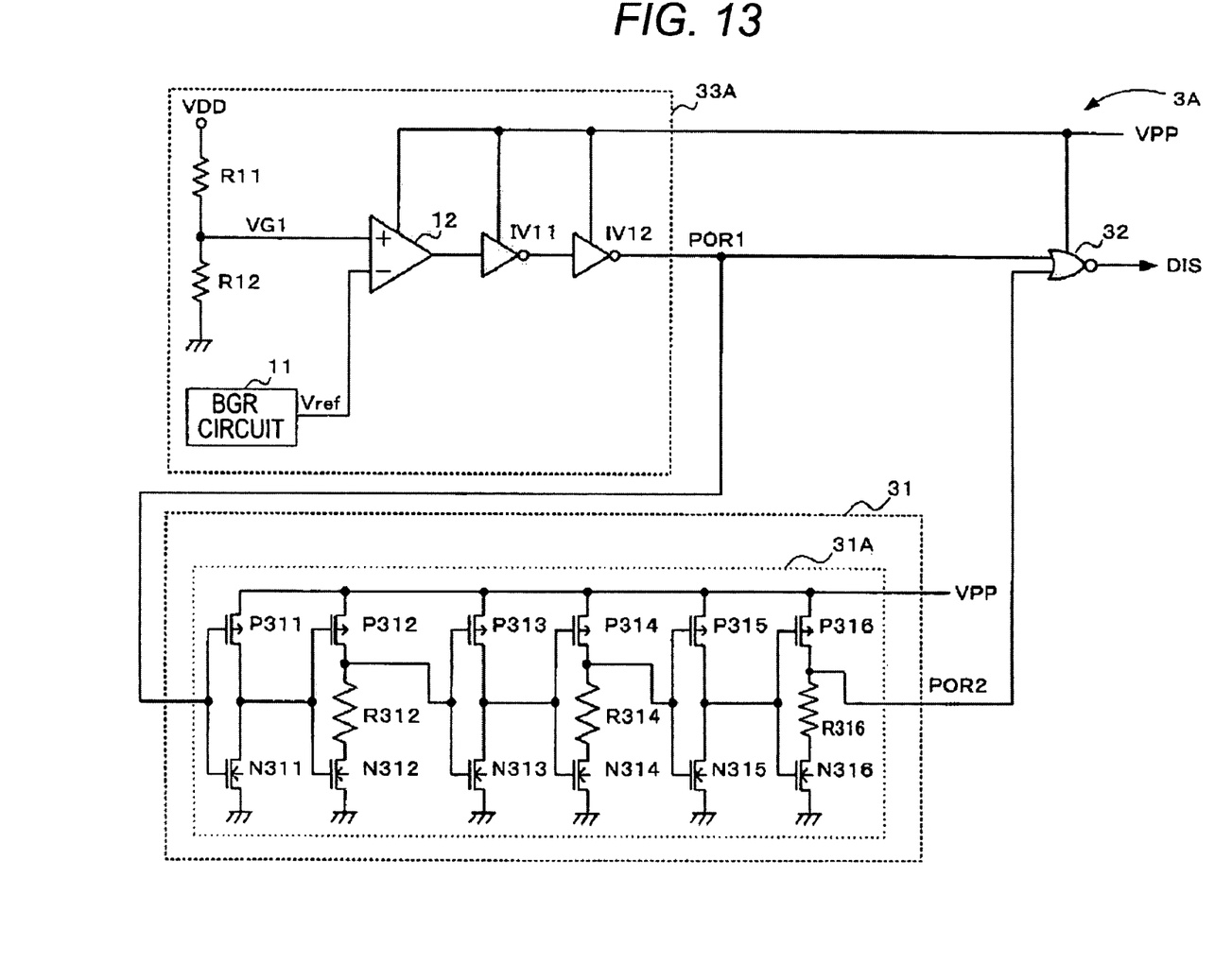
FIG. 13 is a circuit diagram illustrating still another exemplary configuration of the control circuit according to Embodiment 2.

FIG. 13 also illustrates an example of using the voltage VPP as the power supply voltage for the control circuit 3A. In this illustrated example, the dedicated detection circuit 33A having a configuration similar to that of the detection circuit 1A is used, instead of using the dedicated detection circuit 33 illustrated in FIG. 12. Even in this case, an output signal POR1 of the dedicated detection circuit 33A is output at the level of the voltage VPP. Consequently, the POR1 signal can be input directly to the delay portion 31A.

Figure 14:
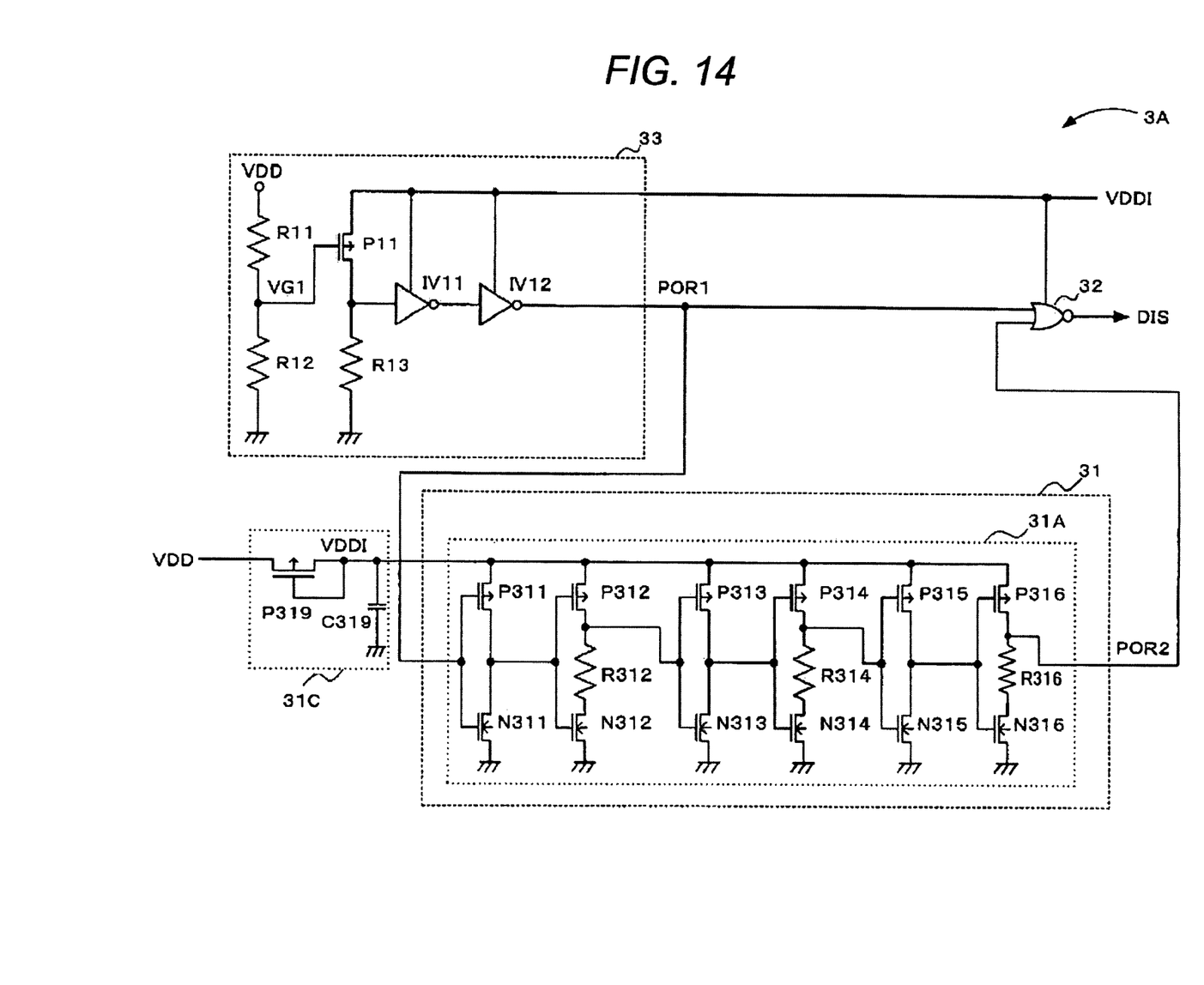
FIG. 14 is a circuit diagram illustrating yet another exemplary configuration of the control circuit according to Embodiment 2.

FIG. 14 illustrates an example of using the internal voltage VDD1 as the power supply voltage for the control circuit 3A. In this example, the internal voltage VDDI is supplied also to the dedicated detection circuit 33. An output signal POR1 of the dedicated detection circuit 33 is output at the level of the internal voltage VDDI. The POR1 signal is input to the delay portion 31A.

Figure 15:
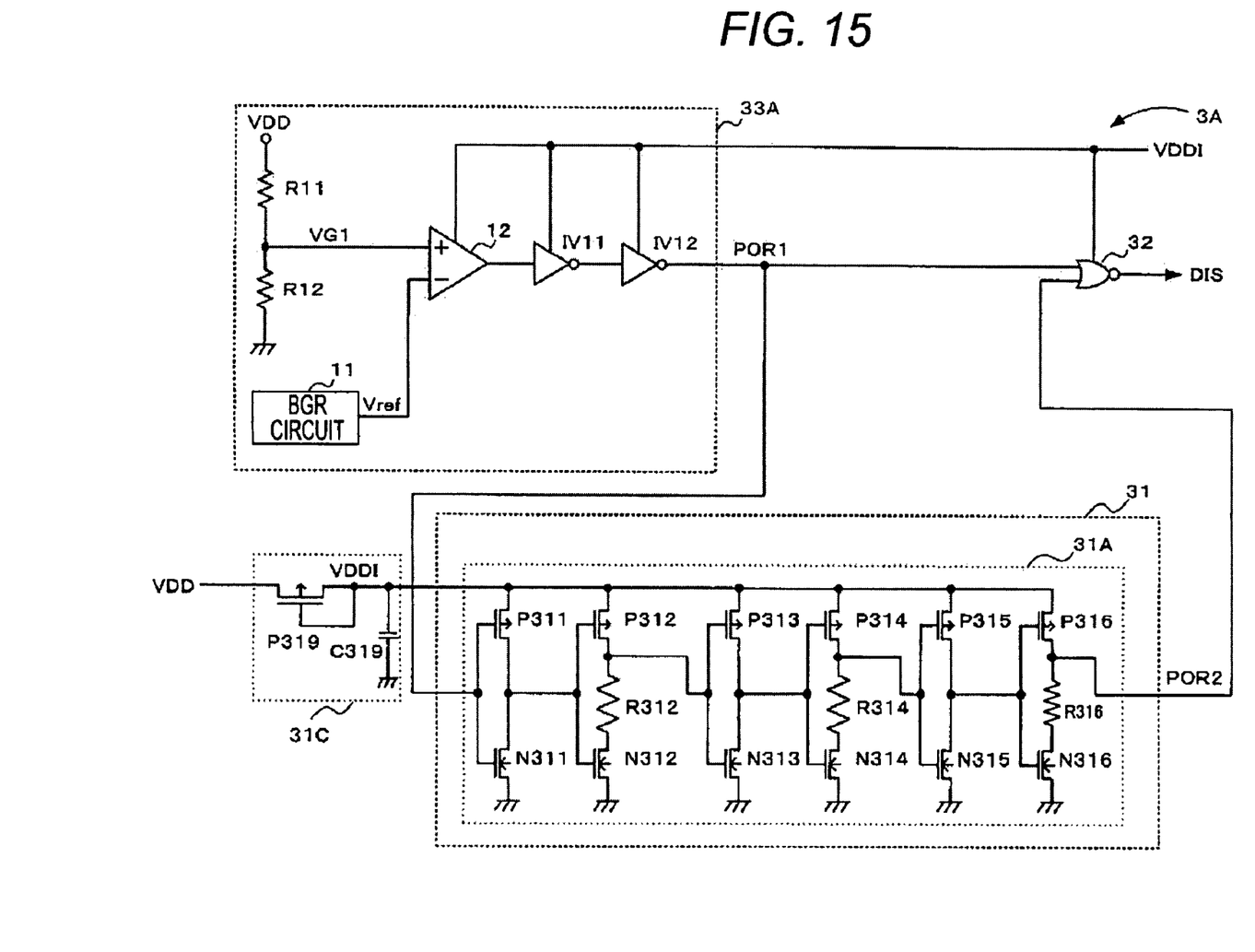
FIG. 15 is a circuit diagram illustrating still a further exemplary configuration of the control circuit according to Embodiment 2.

FIG. 15 also illustrates an example of using the internal voltage VDD1 as the power supply voltage for the control circuit 3A. This example uses the dedicated detection circuit 33A, instead of the dedicated detection circuit 33 illustrated in FIG. 14. In this case, the output signal POR1 of the dedicated detection circuit 33A, which is output at the level of the internal voltage VDDI, is input to the delay portion 31A.

According to the present embodiment, the control circuit 3A is driven by the word line power supply voltage VPP, which is high as compared with the external power supply voltage VDD, or the internal voltage VDDI stored in the high-stabilizing-capacity capacitor C319. Thus, even when the external power supply voltage VDD begins dropping, the control circuit 3A can be operated with a sufficient margin.

Embodiment 3

Figure 16:
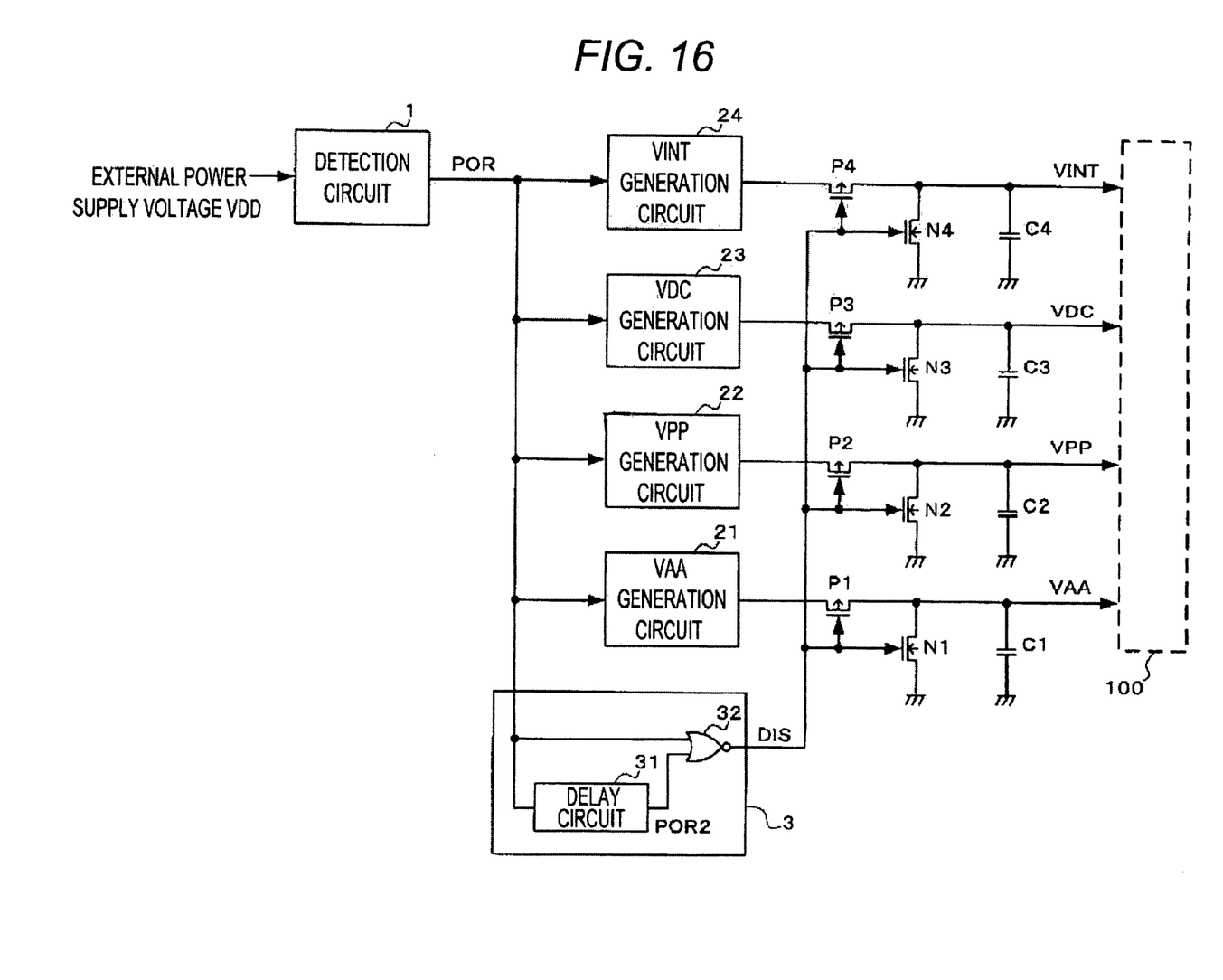
FIG. 16 is a block diagram illustrating an exemplary configuration of a power supply circuit according to Embodiment 3 of the present invention.

FIG. 16 is a block diagram illustrating an exemplary configuration of a power supply circuit according to Embodiment 3 of the present invention.

The power supply circuit according to the present embodiment is constructed by adding an NMOS transistor serving as a discharging circuit to the power supply circuit according to Embodiment 1 illustrated in FIG. 1 by connecting this NMOS transistor between a grounding terminal and the power supply line corresponding to the voltage VPP.

That is, an NMOS transistor N2 is connected between the power supply line corresponding to the voltage VPP and the grounding terminal. The NMOS transistor N2 is controlled according to an output DIS of the control circuit 3.

Figure 17:
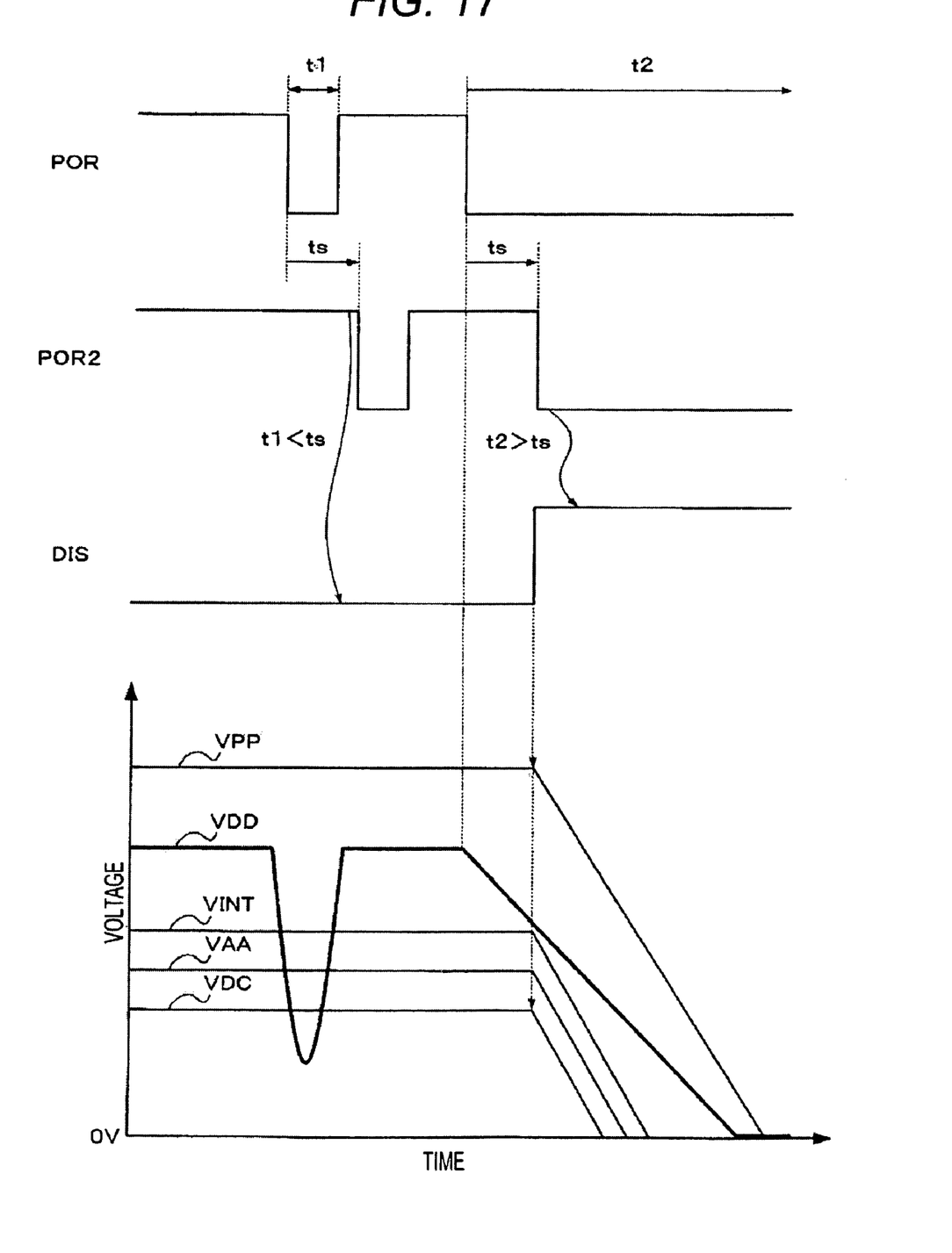
FIG. 17 is a waveform chart illustrating an example of an internal power supply voltage stopping operation of Embodiment 3.

According to Embodiment 3, in a case where the external power supply is interrupted, and where the level of an output signal POR of the detection circuit 1 is "L" for a time longer than the reference time ts, the voltage VPP rapidly drops, similarly to those of the other internal power supply voltages. FIG. 17 illustrates a manner of the fall of each of the internal power supply voltages VAA, VPP, VDC and VINT.

FIG. 17 is a waveform chart illustrating an example of an internal power supply voltage stopping operation by the control circuit 3 according to Embodiment 3.

As described above, in a case where a time t2, during which the level of the output signal POR of the detection circuit is "L", is longer than the reference time ts (t2>ts), the level of the output DIS of the control circuit 3 is "H". Thus, the NMOS transistors N1, N2, N3 and N4 are conducted. Consequently, all of the voltage VAA, the voltage VPP, the voltage VDC, and the voltage VINT rapidly drop.

According to the present embodiment, when the external power supply is interrupted, each internal power supply voltage to be supplied to the ferroelectric memory can quickly be discharged. Consequently, a memory cell can be prevented from erroneously being selected. The reliability of the ferroelectric memory can be enhanced.

According to an aspect of the present invention, the discharging operation of an internal power supply voltage can be controlled according to the continuing time of the dropping state of an external power supply voltage.

What is claimed is:

1. A power supply circuit comprising:
a detection circuit that is connected to an external power supply voltage and that outputs a first signal indicating whether the external power supply voltage is in a dropped-state in which the external power supply voltage is dropped below a reference voltage;
a control circuit that includes:
a delay circuit that outputs a second signal acquired by delaying the first signal for a reference time; and
a determination circuit that outputs a third signal based on the first signal and the second signal;
a generation circuit that generates internal power supply voltage from the external power supply voltage and that supplies the internal power supply voltage; and
an interruption circuit that interrupts the internal power supply voltage supplied from the generation circuit based on the third signal.

2. The power supply circuit according to claim 1, wherein the control circuit controls the interruption circuit to perform an interruption operation when determining that a continuation time of the dropped-state is longer than the reference time.

3. The power supply circuit according to claim 1, wherein the control circuit inhibits the interruption circuit from performing an interruption operation when determining that a continuation time of the dropped-state is shorter than the reference time.

4. The power supply circuit according to claim 1 further comprising:
a holding circuit that holds the internal power supply voltage supplied from the generation circuit; and
a discharging circuit that discharges the holding circuit based on the third signal.

5. The power supply circuit according to claim 4, wherein the control circuit controls the interruption circuit to perform an interruption operation and the discharging circuit to perform a discharge operation, when determining that a continuation time of the dropped-state is longer than the reference time.

6. The power supply circuit according to claim 1, wherein the generation circuit supplies the internal power supply voltage to a memory cell array, and
wherein the interruption circuit interrupts the internal power supply voltage supplied to the memory cell array.

7. The power supply circuit according to claim 1, wherein the detection circuit includes:
a first resistor connected to a power supply line and a divided terminal;
a second resistor connected to the divided terminal and a ground line;
a third resistor connected to the ground line;
a PMOS transistor having
a gate connected to the divided terminal,
a source connected to the power supply line and
a drain connected to the third resistor;
a first inverter connected to the drain of the PMOS transistor; and
a second inverter connected to the first inverter.

8. The power supply circuit according to claim 1, wherein the detection circuit includes:
a first resistor connected to a power supply line and a divided terminal;
a second resistor connected to the divided terminal and a ground line;
a BGR circuit having an output terminal;
a comparator having
a first input terminal connected to the divided terminal,
a second input terminal connected to the output terminal of the BGR circuit and
an output terminal;
a first inverter connected to the output terminal of the comparator; and
a second inverter connected to the first inverter.

9. The power supply circuit according to claim 1, wherein the determination circuit includes a NOR gate circuit.

10. The power supply circuit according to claim 1, wherein the delay circuit is driven by a power supply voltage higher than the external power supply voltage.

11. The power supply circuit according to claim 1, wherein the delay circuit is driven by a power supply voltage lower than the external power supply voltage.

12. The power supply circuit according to claim 1 further comprising:
a second detection circuit that is connected to the external power supply voltage and that outputs the first signal indicating whether the external power supply voltage is in the dropped-state,
wherein the delay circuit outputs the second signal based on the first signal output from the second detection circuit.

13. The power supply circuit according to claim 12, wherein the second detection circuit is driven by a power supply voltage higher than the external power supply voltage.

14. The power supply circuit according to claim 12, wherein the second detection circuit is driven by a power supply voltage lower than the external power supply voltage.

15. A power supply circuit comprising:
a detection circuit connected to an external power supply voltage and configured to detect that the external power supply voltage is in a dropped-state in which the external power supply voltage is dropped below a reference voltage;
a generation circuit configured to generate an internal power supply voltage from the external power supply voltage;
an interruption circuit configured to interrupt the internal power supply voltage output from the generation circuit; and
a control circuit configured to determine whether a continuation time of the dropped-state is shorter than a reference time and to control the interruption circuit based on a determined result,
wherein the control circuit inhibits the interruption circuit from performing an interruption operation when determining that the continuation time of the dropped-state is shorter than the reference time.

* * * * *